United States Patent
Liu et al.

(10) Patent No.: US 10,971,357 B2
(45) Date of Patent: Apr. 6, 2021

(54) THIN FILM TREATMENT PROCESS (71) Applicant: Applied Materials, Inc., Santa Clara, CA (US)

(72) Inventors: Wei Liu, San Jose, CA (US); Theresa Kramer Guarini, San Jose, CA (US); Linlin Wang, Fremont, CA (US); Malcolm Bevan, Santa Clara, CA (US); Johanes S. Swenberg, Los Gatos, CA (US); Vladimir Nagorny, Tracy, CA (US); Bernard L. Hwang, Santa Clara, CA (US); Kin Pong Lo, Fremont, CA (US); Lara Hawrylchak, Gilroy, CA (US); Rene George, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 16/152,395

(22) Filed: Oct. 4, 2018

(65) Prior Publication Data
US 2020/0111659 A1    Apr. 9, 2020

(51) Int. Cl.
*H01L 21/02* (2006.01)
(52) U.S. Cl.
CPC ...... *H01L 21/0228* (2013.01); *H01L 21/0214* (2013.01); *H01L 21/0217* (2013.01); *H01L 21/0234* (2013.01); *H01L 21/02164* (2013.01); *H01L 21/02211* (2013.01)
(58) Field of Classification Search
None
See application file for complete search history.

(56) References Cited

U.S. PATENT DOCUMENTS

| | | | |
|---|---|---|---|
| 6,798,026 B2 | 9/2004 | Hu et al. |
| 6,887,774 B2 | 5/2005 | Hu et al. |
| 7,871,942 B2 | 1/2011 | Kher et al. |
| 8,481,433 B2 | 7/2013 | Bevan et al. |
| 9,054,048 B2 | 6/2015 | Liu et al. |

(Continued)

FOREIGN PATENT DOCUMENTS

| | | |
|---|---|---|
| JP | H09260371 A | 10/1997 |
| JP | 2008511993 A | 4/2008 |
| WO | 2011130326 A2 | 10/2011 |

OTHER PUBLICATIONS

High-density plasma chemical vapor deposition of silicon-based dielectric films for integrated circuits—S.V. Nguyen, IBM J. of Res. & Dev. 43, 1 (1999).

(Continued)

*Primary Examiner* — Shamim Ahmed
*Assistant Examiner* — Bradford M Gates
(74) *Attorney, Agent, or Firm* — Patterson + Sheridan, LLP (57) ABSTRACT

A method of modifying a layer in a semiconductor device is provided. The method includes depositing a low quality film on a semiconductor substrate, and exposing a surface of the low quality film to a first process gas comprising helium while the substrate is heated to a first temperature, and exposing a surface of the low quality film to a second process gas comprising oxygen gas while the substrate is heated to a second temperature that is different than the first temperature. The electrical properties of the film are improved by undergoing the aforementioned processes.

20 Claims, 5 Drawing Sheets

(56) References Cited

U.S. PATENT DOCUMENTS

| | | |
|---|---|---|
| 9,177,787 B2 | 11/2015 | Guarini et al. |
| 2007/0065578 A1* | 3/2007 | McDougall ......... C23C 16/4404 |
| | | 427/248.1 |
| 2013/0217241 A1* | 8/2013 | Underwood ...... H01L 21/02216 |
| | | 438/778 |
| 2015/0214101 A1* | 7/2015 | Ren ................... H01L 21/31138 |
| | | 438/704 |
| 2016/0020073 A1 | 1/2016 | Chae et al. |
| 2017/0365480 A1 | 12/2017 | Swenberg et al. |
| 2017/0365512 A1 | 12/2017 | Swenberg et al. |
| 2018/0082861 A1 | 3/2018 | Citla et al. |

OTHER PUBLICATIONS

The impact of substrate bias on a remote plasma sputter coating process for conformal coverage of trenches and 3D structures, H.L. Brown et al., J. Phys. D: Appl. Phys. 48, 335303 (2015).
International Search Report and the Written Opinion of the International Searching Authority for PCT/US2019/051789 dated Mar. 24, 2020, 12 pages.
Tawainese Office Action issued to 108134784 dated Sep. 25, 2020.

* cited by examiner

THIN FILM TREATMENT PROCESS

BACKGROUND

Field

The present invention relates generally to a method and apparatus for treating a thin film that is to be used in a semiconductor device.

Description of the Related Art

In integrated circuits, smaller transistors, such as metal oxide semiconductor field effect transistors (MOSFETs), are highly desirable. First, smaller transistors enable more transistors to be formed in a given chip area, thereby reducing chip size. Second, smaller transistors can generally switch faster than larger transistors, thereby improving chip performance.

One approach for reducing the size of a MOSFET is by device scaling, in which important device dimensions are reduced proportionally, such as transistor length, transistor width, and oxide (or dielectric) thickness. In this approach, transistor channel resistance does not change as transistor size is reduced, while gate capacitance and RC delay of the transistor decrease proportionally with the size reduction. A common method in the art for growing these increasingly thin films is using an atomic layer deposition (ALD) process, which allows for good control of the thickness at the atomic level, and also provides good conformality of the film. One of the drawbacks of ALD is the poor mechanical and electrical properties of the deposited thin films, which can lead to, for example, current leakage and reduction of the dielectric constant.

As the forgoing illustrates, what is needed in the art is a method of improving the film properties of a film deposited by a chemical vapor deposition (CVD) or an atomic layer deposition (ALD) process. In addition, a modification of the film post-CVD or post-ALD would allow a person skilled in the art to use their current ALD recipes, and follow with a treatment to improve the film after deposition, instead of having to modify already functional and optimized current ALD methods.

Therefore, there is a need for an apparatus and method of treating a deposited thin film to improve its mechanical and/or electrical properties.

SUMMARY OF INVENTION

Embodiments of the disclosure include a method of modifying a layer in a semiconductor device, includes depositing a film that has a low film quality on a semiconductor substrate, and exposing a surface of the low quality film to a process gas comprising helium while the substrate is heated to a first temperature. In some embodiments, the process gas essentially comprises helium.

Embodiments of the disclosure may further include a method of modifying a layer used in a semiconductor device by exposing a surface of the layer to a first process gas comprising helium while the substrate is heated to a first temperature, and exposing a surface of the layer to a second process gas comprising oxygen gas, while the substrate is heated to a second temperature that is different than the first temperature.

Embodiments of the disclosure may further include modifying a layer used to form a semiconductor device to improve the layer's mechanical and electrical properties. The electrical properties of the film are improved by undergoing the aforementioned methods. In addition, for films formed by an ALD process, a treatment process that is performed post-ALD allows a user to use their currently developed and optimized ALD process recipes.

Embodiments of the disclosure may further include a method of modifying a film that has a low film quality in a semiconductor device, including exposing a surface of a low quality film on a substrate to a plasma containing a process gas that comprises helium (He), while the substrate is heated to a first temperature between about 150° C. and about 500° C. and a substrate RF bias can be applied to cause ions formed in the plasma to bombard the surface of the low quality film. The method may also include applying the bias power to the substrate to impart energy to the ions, wherein the ions have an energy of between about 2 eV and about 2,000 eV, and wherein the plasma has an average ion density over the surface of the low quality film during processing of between about 1E10 and 1E12 ions per cubic centimeter ($cm^{-3}$).

Embodiments of the disclosure may further include a method of modifying a low quality film in a semiconductor device, including exposing a surface of a film disposed on a surface of a substrate to a plasma containing a process gas that comprises helium (He). The substrate is heated to a first temperature between about 350° C. and about 500° C. The plasma is created by applying a source power. The plasma has an average ion density over the surface of film during processing of between about 1E10 and 1E12 ions per cubic centimeter ($cm^{-3}$). In some embodiments of the method, a formed self-bias causes ions formed in the plasma to bombard the surface of the film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include a process of treating a film that has low quality to improve its electrical and/or mechanical properties of the film. In some embodiments, the process includes improving the properties of a deposited chemical vapor deposition (CVD) or atomic layer deposition (ALD) layer by exposing the deposited film that is maintained at a controlled temperature to a plasma that has a desired ion density while the surface of the deposited thin film is bombarded with ions formed in the plasma due to a controlled bias power. In some embodiments, the ions formed in the plasma include helium ions, which due to the bias power and/or self-bias formed by the plasma, impart kinetic energy to the deposited film's constituent atoms, which can densify the deposited thin film, remove contaminants found in the deposited thin film (e.g., hydrogen containing impurities), and alter the bonding structure of the atoms in the deposited thin film. The kinetic energy of the ions generated in the plasma is controlled by controlling the plasma ion density and an applied bias power, or sheath voltage created by the self-bias formed by the plasma, which allows tuning of the kinetic energy, as well as tuning of the amount and depth in the film that the ions can penetrate. Embodiments of the disclosure provided herein may be especially useful for, but are not limited to, improving the properties of a low quality film deposited by an ALD process.

Figure 1:
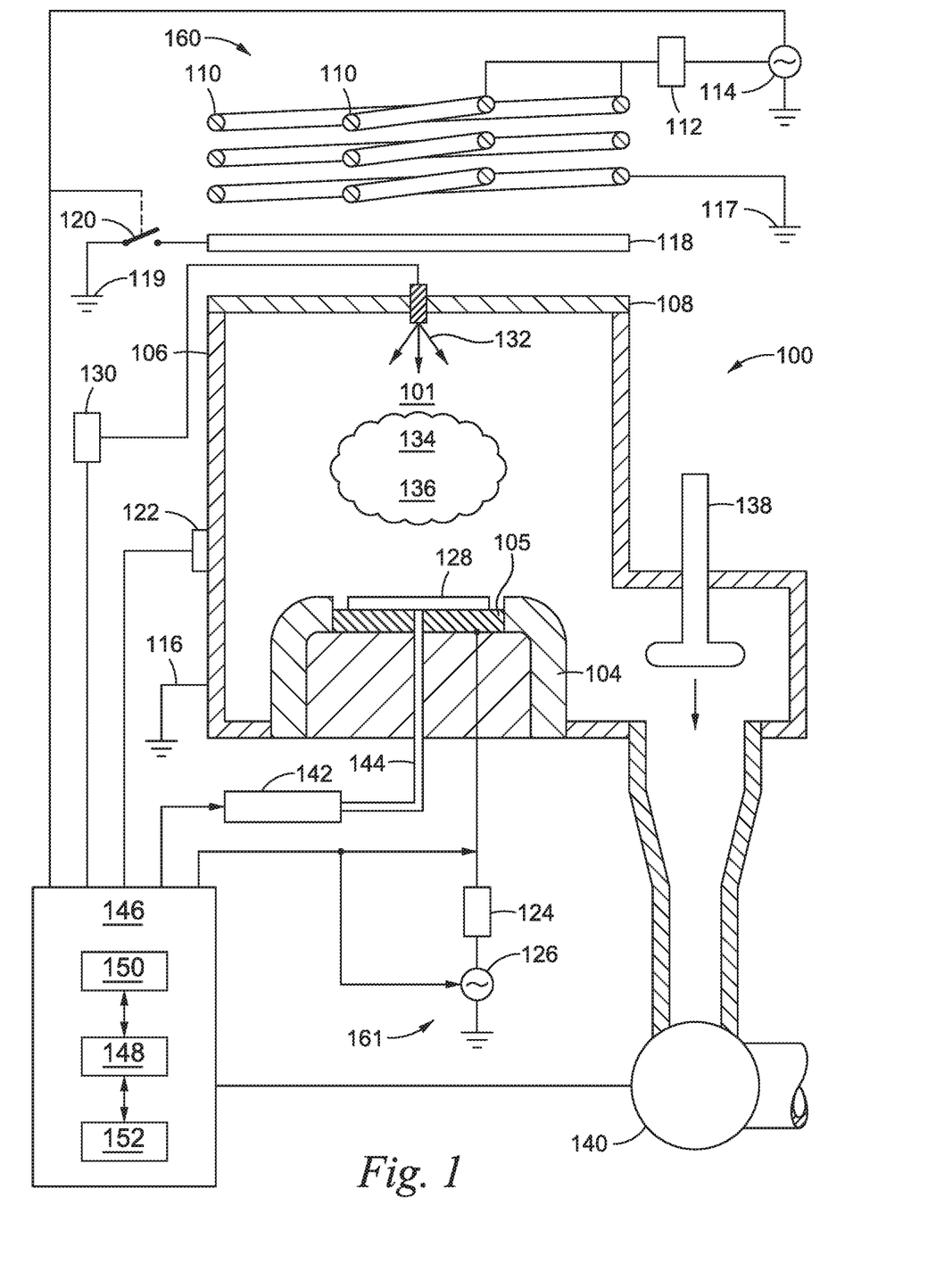
FIG. 1 is a side cross-sectional view of a process system, according to one embodiment.

FIG. 1 is a schematic cross sectional view of a processing chamber assembly 100, according to one embodiment. As shown, the processing chamber assembly 100 includes plasma processing chamber 101, plasma source 160, bias power system 161, and controller 146. The plasma processing chamber 101 provides a chamber for the treatment of a thin film that has been formed on a surface of a substrate 128. Typically, the thin film is deposited on the surface of the substrate 128 in a separate thin film deposition chamber disposed within the processing chamber assembly 100, which in this case can include a cluster tool (not shown) that includes separate thin film deposition chambers (not shown). In some embodiments, the plasma processing chamber 101 may also be additionally configured to deposit a thin film layer on the surface of the substrate. The plasma source 160 converts a gaseous mixture 134 to a plasma 136, which bombards the substrate 128 to alter the properties of the film grown thereon. The bias power system 161 provides a voltage bias across the substrate 128 to facilitate the treatment process. The controller 146 implements the specific process conditions for both film growth and film treatment. The entire processing chamber assembly 100 is configured to grow or process a film formed on the substrate 128 using a specific plasma process provided by use of commands provided by the controller 146. The thin film treatment processes are assisted by the plasma source 160 and the bias power system 161.

As shown, the plasma processing chamber 101 includes chamber wall 106, chamber lid 108, substrate support pedestal 104, electrostatic chuck 105, electrical ground 116, gas panel 130, entry ports 132, throttle valve 138, vacuum pump 140, and gas source 142. Plasma processing chamber 101 may be any suitable plasma processing chamber, such as an inductively coupled plasma (ICP) processing chamber. In one embodiment, the ICP is a chamber downstream from a thin film deposition chamber (not shown). In one embodiment, the processing chamber 101 and the thin film deposition chamber (not shown) are part of the same cluster tool (not shown). The cluster tool (e.g., Centura® system from Applied Materials Inc.) is configured to allow a substrate to be transferred between the thin film deposition chamber and the processing chamber 101 without being exposed to air. In one configuration, the cluster tool includes a central robotic device (not shown) that is positioned within a vacuum environment formed within a transfer chamber, and is adapted to transfer substrates between processing chambers attached to a transfer chamber of the cluster tool. The central robotic device is configured to transfer the substrate between at least the processing chamber 101 and the thin film deposition chamber.

As shown in FIG. 1, processing chamber 101 may include a chamber wall 106, a dielectric chamber lid 108 and a substrate support pedestal 104 disposed within the chamber wall 106. The chamber wall 106 and dielectric chamber lid 108 help isolate the growth method from the outside environment. Typically, chamber wall 106 is coupled to an electrical ground 116. The dielectric chamber lid 108 may be composed of any suitable dielectric, such as quartz. For some embodiments, dielectric chamber lid 108 may assume a different shape (e.g., dome-shaped). In some embodiments, the chamber lid 108 may be coated with a ceramic coating, for protection from plasma species. In one embodiment, the ceramic coating comprises aluminum oxide. The ceramic coating may have a thickness ranging from about 100 microns to about 300 microns, such as about 200 microns.

In operation, a substrate 128, such as a semiconductor substrate, may be placed on pedestal 104, and process gases may be supplied from a gas panel 130 through entry ports 132 in an effort to form a gaseous mixture 134. The substrate 128 is a bare silicon wafer, according to one embodiment. In another embodiment, the substrate 128 is a patterned silicon wafer as is typically used in logic gates, I/O gates, field effect transistors, FINFETs, or memory applications. The device is the combination of the low quality film 320 (FIG. 3B) grown on the substrate 128. Typical process gases that may be used in one or more of the processes described herein are described below. Gaseous mixture 134 may be energized into a plasma 136 in processing chamber 101 by applying power from the RF power source 114. The pressure within the interior of processing chamber 101 may be controlled using a throttle valve 138 and a vacuum pump 140. In some embodiments, the temperature of chamber wall 106 may be controlled using liquid-containing conduits (not shown) that run through chamber wall 106 or heating elements embedded in chamber wall 106 (e.g., heating cartridges or coils) or wrapped around processing chamber 101 (e.g., heater wrap or tape).

The temperature of the substrate 128 may be controlled by controlling the temperature of pedestal 104. In some embodiments, the pedestal 104 includes an electrostatic chuck (ESC) 105, and the substrate 128 is placed on the electrostatic chuck. In some embodiments, the temperature of the electrostatic chuck 105 can be controlled from a range from 20-500° C. by use of heating and cooling elements. In some embodiments, the substrate 128 is "chucked" to the substrate supporting surface of the electrostatic chuck 105 during processing to actively control the temperature of the substrate. The temperature control of the electrostatic chuck 105 and substrate via cooling elements embedded within the pedestal 104 helps reduce unwanted increased temperature due to ion bombardment, as described below. In some embodiments, helium (He) gas from a gas source 142 may be provided via a gas conduit 144 to channels (not shown) formed in the pedestal surface under substrate 128. The helium gas may facilitate heat transfer between pedestal 104 and substrate 128. During processing, pedestal 104 may be heated to a steady state temperature, and then the helium gas may facilitate uniform heating of the substrate 128. Pedestal 104 may be so heated by a heating element (not shown), such as a resistive heater embedded within pedestal 104, or a lamp generally aimed at pedestal 104 or substrate 128 when thereon. Using such thermal control, substrate 128 may be maintained at a first temperature between about 20-500° C. The components of the plasma source 160 provide an environment for the film growth and densification.

As shown, the plasma source 160 includes coil element 110, first impedance matching network 112, RF power source 114, electrical ground 117, shielding electrode 118, electrical ground 119, switch 120, and detector 122. Above a dielectric chamber lid 108, a radio frequency (RF) antenna including at least one inductive coil element 110 is disposed thereon. In one configuration, as shown in FIG. 1 two coaxial coil elements, which are disposed about a central axis of the process chamber, are driven at an RF frequency to generate the plasma 136 in the processing region of the processing chamber assembly 100. In some embodiments, inductive coil elements 110 may be disposed around at least a portion of chamber wall 106. One end of inductive coil element 110 may be coupled, through a first impedance matching network 112, to an RF power source 114, and the other end may end may be connected to an electrical ground 117 as shown. Power source 114 is typically capable of producing up to 4 kilowatts (kW) at a frequency of 13.56 MHz. The RF power supplied to inductive coil elements 110 may be pulsed (i.e., switched between an on and an off state) or power cycled (i.e., varying a power input from a high level to a low level) at a frequency ranging from 1 to 100 kHz. The average ion density of the plasma 136 can be varied from 1E10 to 1E12 ions per cubic centimeter (cm$^{-3}$). The plasma density can be measured by use of any conventional plasma diagnostics technique, such as by use of Self Excited Electron Plasma Resonance Spectroscopy (SEERS), a Langmuir probe or other suitable technique. It is believed that the inductively coupled coaxial coil element 110 configuration illustrated in FIG. 1 provides significant advantage in the control and generation of a high density plasma versus conventional plasma source configurations that include capacitively coupled and plasma source configurations.

Interposed between inductive coil elements 110 of the RF antenna and dielectric chamber lid 108 may be a shielding electrode 118. Shielding electrode 118 may be alternately electrically floating or coupled to an electrical ground 119 via any suitable means for making and breaking an electrical connection, such as a switch 120 as illustrated in FIG. 1.

For some embodiments, a detector 122 may be attached to chamber wall 106 to facilitate determining when a gas mixture within chamber 101 has been energized into plasma. Detector 122 may, for example, detect the radiation emitted by the excited gases or use optical emission spectroscopy (OES) to measure the intensity of one or more wavelengths of light associated with the generated plasma. The entire plasma source 160 creates plasma 136 from the gaseous mixture 134 to treat the deposited thin film.

As shown, the bias power system 161 includes second impedance matching network 124, and biasing power source 126. Pedestal 104 may be coupled, through a second impedance matching network 124, to a biasing power source 126. Biasing power source 126 is generally capable of producing an RF signal having a driven frequency that is within a range from 1 to 160 MHz and power between about 0 kW and about 3 kW, similar to RF power source 114. Biasing power source 126 is typically capable of producing between about 1 W and 1 kilowatts (kW) at a frequency in a range from 2 to 160 MHz, with a frequency of 13.56 MHz or a frequency of 2 MHz. Optionally, biasing power source 126 may be a direct current (DC) or pulsed DC source. In some embodiments, an electrode that is coupled to the biasing power source 126 is disposed within the electrostatic chuck 105. The bias power system 161 provides a substrate voltage bias across the substrate 128 to facilitate the treatment of the deposited thin film. In one embodiment, the RF bias provides energetic ions having up to 2000 eV of ion energy.

As shown, the controller 146 includes central processing unit (CPU) 148, memory 150, and support circuits 152. Controller 146 may interface with RF power source 114, switch 120, detector 122, and biasing power source 126. Controller 146 may be any suitable type of general purpose computer processor that can be used in an industrial setting for controlling various chambers and sub-processors. Memory 150, or other computer-readable medium, for CPU 148 may be one or more of any readily available memory forms, such as random access memory (RAM), read only memory (ROM), a floppy disk, a hard disk, or any other form of digital storage, local or remote. Support circuits 152 may be coupled to CPU 148 in an effort to support the processor in a conventional manner. These circuits may include cache, power supplies, clock circuits, input/output (I/O) circuitry and subsystems, and the like. For some embodiments, the techniques disclosed herein for energizing and maintaining a plasma may be stored in memory 150 a software routine. The software routine may also be stored and/or executed by a second CPU (not shown) that is remotely located from the hardware being controlled by CPU 148. The controller 146 provides the processing chamber assembly 100 and the various subcomponents as mention above with instructions for temperature control, bias voltage, gas flow rate, and the like.

Figure 2:
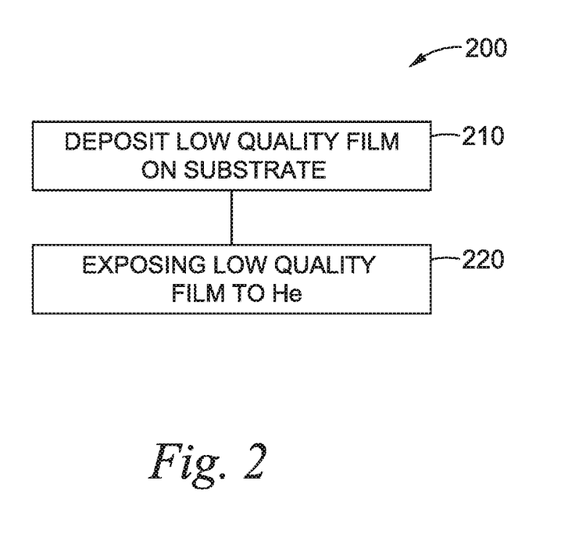
FIG. 2 is a method of treating a low quality film, according to one embodiment.
Figure 3A:
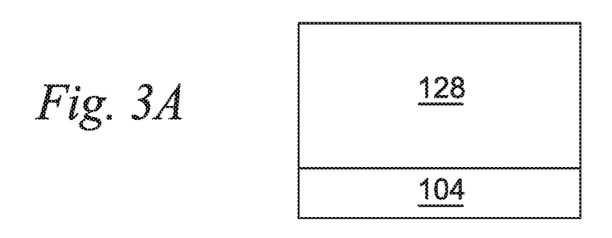
FIG. 3A is a side view of a substrate, according to one embodiment.

FIG. 2 is a flow diagram of method steps for densifying a dielectric film 200, according to one embodiment. Although the method steps are described in conjunction with FIG. 2, persons skilled in the art will understand that any system configured to perform the method steps, in any order, falls within the scope of the embodiments described herein. As shown, the method includes a deposition process 210, and a treatment process 220. FIG. 3A illustrates the substrate 128 placed on the substrate support pedestal 104, before the deposition process 210, according to one embodiment. While the discussion below describes the deposition process 210 as being a low quality film deposition process, this configuration is not intended to be limiting as to the scope of the disclosure herein, since other deposited thin films (e.g., metal or semiconductor material layers, high-k dielectrics, gate oxides), may benefit from the subsequent treatment process 220 described herein. However, it has been found that ALD and CVD films that, as formed, have a low film quality can receive a significant benefit by using one or more of the processes described herein.

Figure 3B:
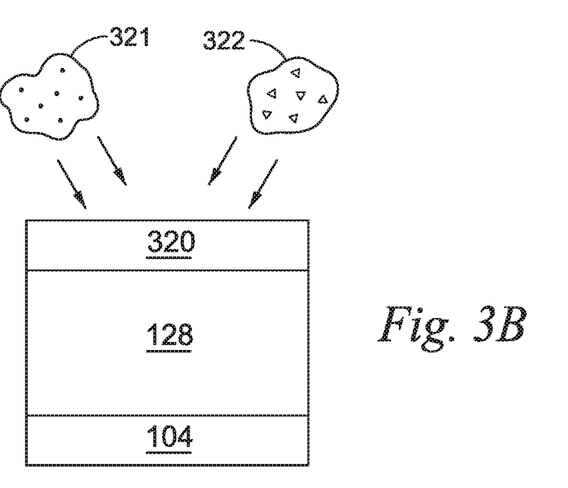
FIG. 3B is a side view of a substrate during growth of a film, according to one embodiment.

In one example, as shown in FIG. 3B, a deposited low quality film 320 is formed during the deposition process 210 on a substrate 128. In the deposition process 210, a low quality film 320 is deposited by an ALD process, according to one embodiment. The low quality film 320 can be hafnium oxide, silicon oxide, silicon nitride, or silicon oxynitride. The low quality film 320 can be a gate oxide, according to one embodiment. A primary precursor 321 and a secondary precursor 322 are applied to the surface of the substrate 128. In one embodiment, the primary precursor is silane or another Si-containing precursor. In one embodiment, the secondary precursor 322 is water. The film can also be grown by chemical vapor deposition, pulsed laser deposition, chemical oxidation, or the like. In an exemplary embodiment, the low quality film 320 is a silicon oxide film grown to a thickness of between 25-100 Å, such as a thickness of between 25-35 Å. The low quality film 320 deposited in this way is often of poor quality, with unwanted interstitial hydrogen, dangling silicon bonds, and oxygen or nitrogen vacancies. The erratic crystal structure of the deposited low quality film 320 leads to issues such as trapped charge states, nonuniform growth, and reduced dielectric constant, all of which lead to gate leakage and cause problems with the device function. The dangling silicon bonds result in non-$sp^3$ bonding, such as sp or $sp^2$ bonding, which causes nonuniform growth and non-3D growth, contributing to domain formation or island growth. In addition, the low quality of the deposited low quality film 320 leads to poor wet and dry etch rates.

Figure 3C:
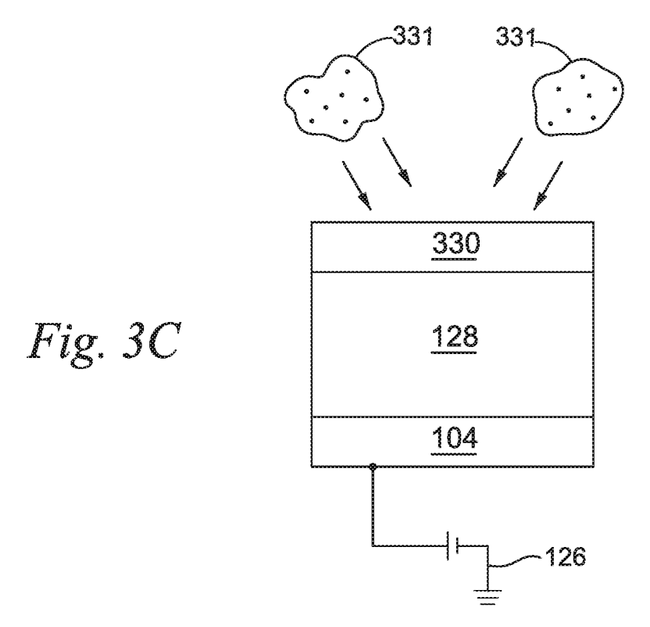
FIG. 3C is a side of view of a substrate with a film during a first process, according to one embodiment.

FIG. 3C illustrates the substrate 128 with a deposited low quality film 330 that is exposed to a treatment process 220. In the treatment process 220, the low quality film 320 is bombarded by a process gas 331, according to one embodiment. The process gas 331 comprises helium. Helium is chosen as the nonreactive process gas 331 as it is the lightest of the noble elements, and thus will provide the smallest amount of damage to the processed film at the same bias voltages. In addition, as helium is a noble element, it does not form unwanted chemical bonds with the atoms in the low quality film 320. The low quality film 330 is bombarded by the process gas 331, and the provided kinetic energy of the process gas can be used to break unwanted hydrogen bonds previous formed between the hydrogen atom other atoms within the film. The now free hydrogen atoms combine with other free hydrogen atoms to make hydrogen gas, which then exits the low quality film 320. Alternatively, the free hydrogen atoms bond with hydrogen impurities present in the low quality film 320, which form hydrogen gas, and the hydrogen gas exits the low quality film. In one embodiment, the low quality film 320 contains oxygen, and the free hydrogen atoms combine with the oxygen to make water, which then vaporizes from or desorbs from the low quality film. In one embodiment, the low quality film 320 comprises silicon, and the silicon atoms form new silicon-oxygen bond in the case of a silicon oxide containing film or a silicon-nitrogen bond in a silicon nitride containing film after the removal of the hydrogen impurities as described above. In some embodiments, the electrical and/or mechanical properties of the low quality film are each improved, such as the film's dielectric properties, density, hardness and tensile strength.

In one embodiment, the process gas 331 is further comprised of a secondary gas comprising oxygen gas, nitrogen gas, ammonia, nitride trifluoride gas, argon gas, or any combination of the above, and the process gas may be energized into a plasma by applying using the source power 114, which creates ions, such as $Ar^+$, $O^+$, $O_2^+$, $He^+$, $N_2^+$, $NH_2^+$, $NH^+$, $NF_3^+$, $NF_2^+$, or $NF^+$, or radicals, such as O, NH, N, or F. In one embodiment, the low quality film 320 comprises silicon oxide, silicon nitride, or silicon oxynitride, and oxygen- or nitrogen-consisting ions or radicals can be embedded in the deposited low quality film 330, which heal oxygen or nitrogen vacancies, and facilitate silicon-oxygen or silicon-nitrogen bonds to be formed from the unwanted dangling bonds. The percentage of oxygen or nitrogen in the process gas 331 can be varied to control the amount of oxygen or nitrogen vacancies healed in the deposited low quality film 330. The higher ion density allows more ions to impact on the low quality film 320, increasing the number of vacancies healed and the number of impurities removed.

In one embodiment, the process gas 331 essentially includes a single type of gas, such helium. In another embodiment, the process gas 331 is a gas mixture (i.e., gas mixture 134) that includes helium and a secondary gas that includes oxygen, where the oxygen percentage by volume is about 5-90%, and the helium percentage is the remainder. In one embodiment, the process gases flow time is from about 1 s to 10 min. In one embodiment, the pressure can be controlled from about 5-200 mTorr. In one embodiment, the secondary gas can be provided without helium.

In one embodiment, the substrate support pedestal 104 may be coupled to a biasing power source 126, which allows a bias power to be applied to the substrate 128. In one embodiment, the substrate 128 is a patterned wafer, and the bias power increases conformality of the low quality film 320 on the sidewall of the wafer pattern. In one embodiment, the bias power charges the substrate 128. When the substrate 128 is charged, it attracts the ions from the plasma 136 electrostatically, and the charged ions bombard the low quality film 320. In another embodiment, the bias power creates a plasma sheath over the surface of the substrate 128, which causes ions to bombard and interact with the atoms in the substrate. A higher bias power increases the penetration depth of the ions, allowing for the treatment of thicker low quality films 320. In another embodiment, no bias power is provided, and the charged ions are attracted to the surface of the substrate due to the formed sheath voltage created by the self-bias. The self-bias is created by the voltage difference formed between the electrically charged plasma and the at least partially grounded substrate support. The self-bias can be adjusted by adjusting the process gas pressure within the chamber, and by adjusting the power applied by the RF power source 114 to the process gas, both of which affect the density of the plasma and the voltage formed between the formed plasma and the grounded substrate.

In one embodiment, the substrate 128 comprises silicon oxide or silicon oxynitride, the secondary gas comprises oxygen gas, and bias power facilitates the filling of oxygen vacancies in the deposited low quality film 320 by the creation of a plasma sheath over the surface of the substrate, which causes the oxygen ions to bombard and interact with the oxygen vacancies at or below the exposed surface of the film on the substrate. The oxygen ions embed into the low quality film 128 and form silicon-oxygen bonds, filling any oxygen vacancies in the low quality film. In some cases, the formation of oxygen radicals (O*) are useful because they will diffuse into the surface of the film due to the thermal energy supplied to the radicals by the plasma, and thus the radicals will be able to interact with the oxygen vacancies at or below the exposed surface of the film on the substrate.

In another embodiment, the substrate 128 comprises silicon nitride or silicon oxynitride, the secondary gas comprises nitrogen gas or ammonia, and the bias power facilitates the filling of nitrogen vacancies in the deposited low quality film 320 by attracting nitrogen ions or radicals. In some embodiments, the bias power is used to facilitate the filling of nitrogen vacancies in the deposited low quality film 320 by the creation of a plasma sheath over the surface of the substrate, which causes the nitrogen ions to bombard and interact with the nitrogen vacancies at or below the exposed surface of the film on the substrate. The nitrogen ions embed into the low quality film 128 and form silicon-nitrogen bonds, filling any nitrogen vacancies in the low quality film. In one embodiment of a treatment process of an ALD nitride film, the substrate temperature is held at between about 150° C. and about 350° C., an RF power of between about 2000 W and about 2250 W is provided to the process gas to form a plasma, a substrate RF bias power of about 0-10 W (e.g., 1-10 W) is applied, the chamber is held at about 10 mTorr, and helium is flowed for a processing period of about 10 min.

The bombardment of the low quality film due to the ionized process gas 331 reduces trapped charge states, tends to planarize the grown film and can improve the mechanical and electrical properties (e.g., dielectric constant) of the film, all of which reduce gate leakage and ensure proper device function. The treatment process will densify the formed low quality film by removal of dangling silicon bonds, which results in $sp^3$ bonding, facilitating uniform film mechanical and electrical properties. The wet and dry etch rate of the films are also improved. The overall process of process gas bombardment results in a better quality layer than the first deposited layer. Better control of the quality of the low quality film allows for lower gate leakage current density and better equivalent-oxide-thickness (EOT) scaling necessary for the function of modern semiconductor devices.

In one embodiment, the substrate support pedestal 104 is heated by a heating element (not shown), such as a resistive heater embedded within pedestal 104, or a lamp generally aimed at pedestal 104 or substrate 128 when thereon. Using such thermal control, substrate 128 may be maintained at a temperature between about 20-500° C. In one embodiment, the pedestal is maintained at a temperature greater than about 150° C., such as greater than about 250° C. In one embodiment, the low quality film 320 is silicon oxide, silicon nitride, or silicon oxynitride, and the thermal control increases the rate of departure of the hydrogen impurities, and thus the rate of the silicon-oxygen and silicon-nitrogen bond formation during the treatment process.

During the treatment process 220, the substrate temperature is held and controlled at a temperature between about 20° C. and 500° C., while an RF power of between about 50 W and 4 kW is provided to the process gas and a substrate RF bias power of between about 1 watt (W) and 1000 W is applied, and a chamber process pressure of between about 5 mTorr and about 200 mTorr for a period of between about 1 second and about 15 min. The combination of the temperature control of the substrate, the bias power, and the source power 114 allows for a better quality film 320 to be produced. The use of all three process parameters at once during the treatment process 220 will allow a plasma 136 that has a desirable ion density that will assure that a desired ion bombardment rate (ions/second) and bombardment density (ions/cm$^2$) are achieved, the bombarding ions have a desired kinetic energy (eV), and the bombarded film has a desired amount of added thermal energy (Watts/cm$^2$) to increase the process reaction rate, allow atoms to move around to more preferential bonding sites, remove impurities and increase the densification of the film, which will lead to a more uniform and conformal film, with lower amounts of vacancies or unwanted impurity atoms. In one process example, the average plasma ion density over the substrate surface during processing is controlled to between about 1E10 and 1E12 ions per cubic centimeter (cm$^{-3}$), the RF bias is applied to the substrate to impart an average ion energy of between about 2 eV and about 2,000 eV to the ions generated in the plasma and the substrate is maintained at a temperature of between about 20° C. and about 500° C., such as between 350° C. and 500° C. In another process example, the average plasma ion density over the substrate surface during processing is controlled to between about 1E10 and 1E12 ions per cubic centimeter (cm$^{-3}$), the RF bias is applied to the substrate to impart an average ion energy of between about 2 eV and about 30 eV, such as between about 2 eV and 10 eV to the ions generated in the plasma and the substrate is maintained at a temperature of between about 20° C. and about 500° C., such as between 150° C. and 500° C., or between 250° C. and 500° C., or between 350° C. and 500° C.

As noted above, control of the plasma ion density during processing is used to assure that a desired ion bombardment rate (ions/second) and ion bombardment density (ions/cm$^2$) are achieved, which will among other things affect the amount of damage that will be created in the low quality film 320 during processing. In one example, a 1E10 ion density is preferred for applications that require ions to be implanted to a desired depth within the film, since a higher plasma ion density, such as 1E12 would greatly increase the damage caused during processing when keeping the other process variable constant (e.g., substrate bias and temperature). In some embodiments, the implanted ions comprise oxygen or nitrogen. The control of the substrate bias allows the kinetic energy (eV) of the bombarding ions to be controlled to adjust the depth of penetration and/or densifying effect of the bombarding ions, and help remove unwanted impurities from the low quality films 320. Separate from the other variables, adding thermal energy (Watts/cm$^2$) to the film during processing will increase the reaction rate of any chemical reactions occurring with the film, allow atoms to move around to more preferential bonding sites to reduce or alter the damage provided by the bombarding ions, remove impurities found in the formed low quality film 320 layer and increase the densification of the low quality film 320.

In one exemplary embodiment of the treatment process 220, the substrate temperature is held at about 250° C., an RF power of about 2000 W is provided to the process gas, a substrate RF bias power of about 0-10 W (e.g., 1 to 10 W) is applied, the chamber is held at about 20 mTorr, and helium is flowed without a secondary gas for a period of about 4 min. In another exemplary embodiment of the treatment process 220, the substrate temperature is held at about 250° C., an RF power of about 2250 W is provided to the process gas, a substrate RF bias power of about 0-10 W (e.g., 1-10 W) is applied, the chamber is held at about 5 mTorr, and helium is flowed without a secondary gas for a period of about 15 min.

Figure 4:
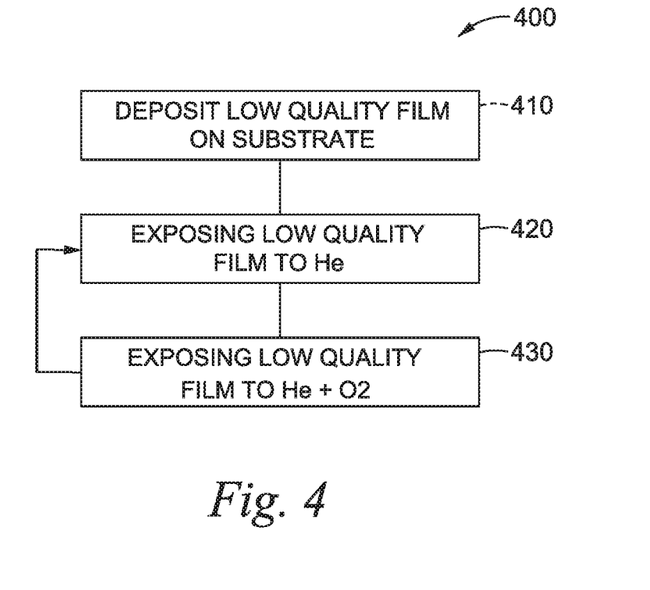
FIG. 4 is a method of treating a dielectric film, according to one embodiment.
Figure 5A:
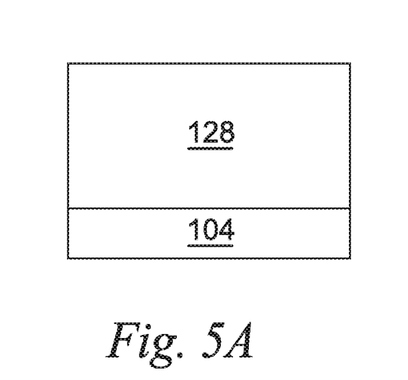
FIG. 5A is a side view of a substrate, according to one embodiment.

FIG. 4 is a flow diagram of method steps for treating a dielectric film 400, according to one embodiment. Although the method steps are described in conjunction with FIG. 4, persons skilled in the art will understand that any system configured to perform the method steps, in any order, falls within the scope of the embodiments described herein. As shown, the method includes a film deposition process 410, a first treatment process 420, and a second treatment process 430. FIG. 5 illustrates a substrate during the method of 400, according to one embodiment. FIG. 5A illustrates the substrate 128 placed on the substrate support pedestal 104, before the film deposition process 410, according to one embodiment.

Figure 5B:
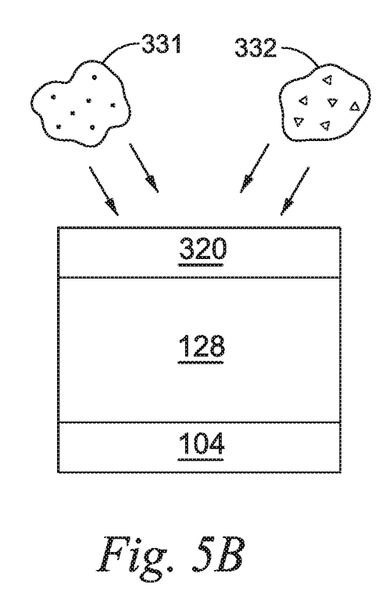
FIG. 5B is a side view of a substrate during growth of a film, according to one embodiment.

FIG. 5B illustrates the substrate 128 with a deposited low quality film 320 deposited by film deposition process 410. The film deposition process 410 proceeds similarly to the deposition process 210. The film can be grown by an atomic layer deposition, chemical vapor deposition, pulsed laser deposition, chemical oxidation, or other similar process. In an exemplary embodiment, the low quality film may be a silicon oxide, hafnium silicate, zirconium silicate, hafnium oxide or zirconium oxide film grown to a thickness between 25-100 Å. In one ALD process example, the substrate surface is cyclically contacted with at least one oxygen gas (e.g., $O_2$, $H_2O$), nitrogen containing gas (e.g., $N_2$, $NH_3$) and/or silicon containing precursor (e.g., silane containing precursor) to deposit a film comprising silicon, wherein the substrate surface has a temperature of about 200° C. or greater.

Figure 5C:
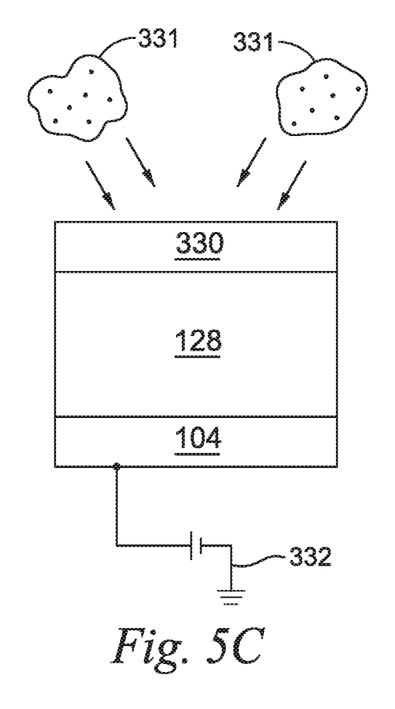
FIG. 5C is a side of view of a substrate with a film during a first process, according to one embodiment.

FIG. 5C illustrates the substrate 128 with a deposited low quality film 330 exposed to a first treatment process 420. The first treatment process 420 is performed similarly to the treatment process 320 described above.

Figure 5D:
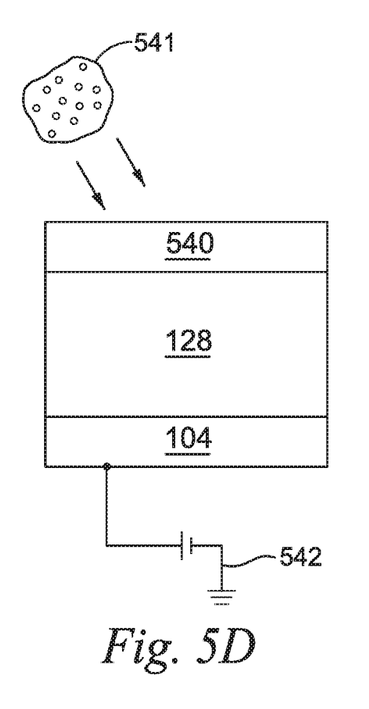
FIG. 5D is a side of view of a substrate with a film during a second process, according to one embodiment.

FIG. 5D illustrates the substrate 128 with a processed low quality film 540 exposed to second treatment process 430. In the second treatment process 430, the deposited low quality film 330 is bombarded by an ionized portion of a second process gas 331, according to one embodiment. The second process gas 331 includes oxygen, and may further include a secondary gas including helium, nitrogen gas, ammonia, argon, nitrogen trifluoride gas, or any combination of the above. In one embodiment, the process gas 331 further includes of a secondary gas comprising nitrogen gas, ammonia, fluorine gas, or any combination of the above, and the secondary gas may be energized into a plasma by a source power 114, which creates ions, such as $Ar^+$, $He^+$, $N_2^+$, $NH_2^+$, $NH^+$, $NF_3^+$, $NF_2^+$, or $NF^+$, or radicals, such as NH or F.

The first treatment process 420 and second treatment process 430 can be sequentially repeated multiple times, in order to continue the improvement of the properties of the processed thin film. It is believed that repeating the process steps at least twice can increase the properties of the low quality film with each pass. The first and second treatment processes can be performed in any order or simultaneously. The overall process of bombarding the deposited low quality film will result in a better quality low quality film than the as-deposited low quality film.

In an exemplary embodiment, the first temperature during the first treatment process 420 is held at 450° C., the second temperature during the second treatment process 430 is held at 450° C., the first source power 114 is 200 W, the bias power is between 0 and 100 W (e.g., 1-100 W), the pressure is held at 100 mTorr, the helium and oxygen are coflowed with 50% oxygen and 50% helium by volume, and the process is performed for less than or equal to 1 min. In another exemplary embodiment, the first temperature is held at 450° C., the second temperature is held at 450° C., the first source power 114 is 100 W, the bias power is 800 W, the pressure is held at 10 mTorr, the helium and oxygen are coflowed with 10% oxygen and 90% helium by volume, and the process is performed for 4 min.

The poor film quality of a deposited ALD layer can be improved by bombarding the deposited film with helium. The helium imparts kinetic energy to the constituent atoms of the film, which in silicon containing films can be used to remove hydrogen impurities as hydrogen gas or water, causing formation of silicon-silicon, silicon-nitrogen, or silicon-oxygen bonds. The kinetic energy of the helium is controlled by a source power, which allows tuning of the kinetic energy, as well as tuning of the depth in the film that the helium can penetrate. The addition of an oxygen plasma created by a source power also replenishes oxygen vacancies with oxygen, restoring the crystal structure closer to pristine silicon oxide.

The forgoing illustrates a method of improving the low quality film deposited by ALD. The electrical properties of the low quality film are improved by undergoing the aforementioned processes. In addition, a modification of the low quality film post-ALD allows a person skilled in the art to use their current ALD recipes, and follow with a treatment to improve the low quality film after deposition, instead of having to modify already functional and optimized current ALD methods.

While the foregoing is directed to embodiments of the present disclosure, other and further embodiments of the disclosure may be devised without departing from the basic scope thereof, and the scope thereof is determined by the claims that follow.

What is claimed is:

1. A method of modifying a low quality film in a semiconductor device, comprising:
    exposing a surface of the film disposed on a surface of a substrate to a first plasma formed from a first process gas that comprises helium, while the substrate is heated to a first temperature between about 350° C. and about 500° C. and a first radio frequency (RF) is applied to cause ions formed in the first plasma to bombard the surface of the film; and
    exposing the surface of the film disposed on the surface of the substrate to a second plasma formed from a second process gas that comprises helium and oxygen gas, while a second RF bias different from the first RF is applied to the substrate.

2. The method of claim 1, wherein the applying the second RF bias imparts energy to at least a portion of the ions formed in the second plasma of between about 2 eV and about 2,000 eV.

3. The method of claim 2, wherein the first plasma has an average ion density over the surface of film during processing of between about $1\times10^{10}$ and $1\times10^{12}$ ions per cubic centimeter ($cm^{-3}$).

4. The method of claim 2, wherein the first plasma is created by applying a source power.

5. The method of claim 1, wherein the first process gas further comprises a secondary gas, wherein the secondary gas comprises oxygen gas, nitrogen trifluoride gas ($NF_3$), nitrogen gas ($N_2$), and ammonia ($NH_3$).

6. The method of claim 1, wherein the film is selected from the group consisting of silicon, silicon oxide, silicon nitride, and silicon oxynitride.

7. The method of claim 1, further comprising depositing the film by an atomic layer deposition.

8. The method of claim 7, wherein depositing the film further comprises exposing the surface to a primary precursor and a secondary precursor, wherein the primary precursor is a silicon based precursor, and the secondary precursor is water.

9. The method of claim 7, wherein depositing the film further comprises exposing the surface to a primary precursor and a secondary precursor, wherein the primary precursor is a silicon based precursor, and the secondary precursor is selected from the group consisting of nitrogen gas ($N_2$) and ammonia ($NH_3$).

10. The method of claim 1, wherein:
    the film is grown in a thin film deposition chamber;
    exposing the surface of the film on the substrate is performed in a processing chamber; and
    the thin film deposition chamber and the processing chamber are coupled to a cluster tool that is configured to allow the substrate to be transferred between the thin film deposition chamber and the processing chamber without being exposed to air.

11. A method of modifying a film in a semiconductor device, comprising:
    depositing the film on a substrate in a first processing chamber;
    exposing a surface of the film to a first plasma formed from a first process gas in a second processing chamber, wherein the first process gas comprises helium, while the substrate is heated to a first temperature between about 150 and about 500° C., and a first radio frequency (RF) is applied to cause ions formed in the first plasma to bombard the surface of the film; and
    exposing the surface of the film to a second plasma formed from a second process gas, wherein the second process gas comprises helium and oxygen gas, while the substrate is heated to a second temperature that is different than the first temperature and while a second RF bias is applied to the substrate.

12. The method of claim 11, wherein the second RF bias imparts energy to the ions generated in the second plasma so that the ions bombard the surface of the film, wherein the ions have an average ion energy of between about 2 and 2,000 eV.

13. The method of claim 12, wherein the first and the second plasmas comprise an average ion density over the surface of the film of between about $1\times10^{10}$ and $1\times10^{12}$ ions per cubic centimeter ($cm^{-3}$).

14. The method of claim 11, wherein the exposing the surface of the film to the first plasma and the exposing the surface of the film to the second plasma is repeated at least twice.

15. The method of claim 11, wherein the first process gas further comprises a gas is selected from the group consisting of nitrogen trifluoride gas ($NF_3$), nitrogen gas ($N_2$), and ammonia ($NH_3$).

16. The method of claim 11, wherein the second process gas further comprises a secondary process gas, wherein the secondary process gas is selected from the group consisting of nitrogen fluoride gas ($NF_3$), nitrogen gas ($N_2$), and ammonia ($NH_3$).

17. The method of claim 11, wherein the film is selected from the group consisting of silicon, silicone oxide, silicon nitride, and silicon oxynitride, and wherein depositing the film comprises forming the film by an atomic layer deposition process.

18. The method of claim 17, wherein depositing the film further comprises exposing the surface to a primary precursor and a secondary precursor, wherein the primary precursor is a silicon based precursor, and the secondary precursor is water.

19. The method of claim 17, wherein depositing the film further comprises exposing the surface to a primary precursor and a secondary precursor, wherein the primary precursor is a silicon based precursor, and the secondary precursor is selected from the group consisting of nitrogen gas ($N_2$) and ammonia ($NH_3$).

20. A method of modifying a film in a semiconductor device, comprising:
    exposing a surface of the film disposed on a surface of a substrate to a first plasma formed from a first process gas that comprises helium, while the substrate is heated to a first temperature between about 150° C. and about 500° C., wherein the first plasma is created by applying a first source power to the first process gas, and the first plasma has an average ion density over the surface of film during processing of between about $1\times10^{10}$ and $1\times10^{12}$ ions per cubic centimeter ($cm^{-3}$); and
    exposing the surface of the film disposed on the surface of the substrate to a second plasma formed from a second process gas that comprises helium and oxygen, wherein the second plasma is created by applying a second source power greater than the first source power to the second process gas.

* * * * *

UNITED STATES PATENT AND TRADEMARK OFFICE
CERTIFICATE OF CORRECTION

PATENT NO. : 10,971,357 B2
APPLICATION NO. : 16/152395
DATED : April 6, 2021
INVENTOR(S) : Wei Liu et al.

It is certified that error appears in the above-identified patent and that said Letters Patent is hereby corrected as shown below:

In the Claims

In Column 12, Line 17, in Claim 1, delete "a low quality" and insert -- a --, therefor.

In Column 13, Line 11, in Claim 11, delete "150" and insert -- 150° C. --, therefor.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*